United States Patent [19]
Copeland et al.

[11] Patent Number: 5,793,998
[45] Date of Patent: *Aug. 11, 1998

[54] METHOD AND APPARATUS FOR INTERCONNECTION OF MULTIPLE MODULES

[75] Inventors: Jeffrey P. Copeland, Jefferson; Jonathan C. Crowell, Dorchester, both of Mass.

[73] Assignee: Digital Equipment Corporation, Maynard, Mass.

[*] Notice: This patent issued on a continued prosecution application filed under 37 CFR 1.53(d), and is subject to the twenty year patent term provisions of 35 U.S.C. 154(a)(2).

[21] Appl. No.: 633,988

[22] Filed: Apr. 17, 1996

[51] Int. Cl.$^6$ ........................................................ G06F 13/00
[52] U.S. Cl. ............................. 395/309; 361/748; 361/760
[58] Field of Search .............................. 395/281, 309; 361/748–760

[56] References Cited

U.S. PATENT DOCUMENTS

| | | | |
|---|---|---|---|
| 4,401,351 | 8/1983 | Record | 339/17 LM |
| 4,477,862 | 10/1984 | Gonzales | 361/393 |
| 4,558,914 | 12/1985 | Prager et al. | 439/259 |
| 4,744,025 | 5/1988 | Lipcon et al. | 364/200 |
| 4,818,237 | 4/1989 | Weber et al. | 439/693 |
| 4,858,070 | 8/1989 | Buron et al. | 361/384 |
| 5,073,854 | 12/1991 | Martin et al. | 395/281 |
| 5,230,638 | 7/1993 | DiViesti et al. | 439/567 |
| 5,239,632 | 8/1993 | Larner | 395/281 |
| 5,274,783 | 12/1993 | House et al. | 395/281 |
| 5,334,046 | 8/1994 | Brovillette et al. | 439/540 |
| 5,335,144 | 8/1994 | Maroushek et al. | 361/695 |
| 5,349,343 | 9/1994 | Oliver et al. | 340/825 |
| 5,492,481 | 2/1996 | Lewis et al. | 439/159 |

OTHER PUBLICATIONS

Bus Architecture Standards Committee of the IEEE Computer Society. "Proposed Standard Physical and Environmental Layers For a PCI Mezzanine Card: PMC", Feb. 17, 1994.

Electronic Industry Association. "1.0 Millimeter, Two-Part Connectors for Use with Parallel Printed Boards", Feb. 1994.

Gordon Bell, Digital Press. "Computer Engineering", A DEC view of Hardware Systems Design, Sep. 1978 (pp. 281–282).

Bus Architecture Standards Committee of the IEEE Computer Society. "Proposed Standard for Common Mezzanine Card Family: CMC", Feb. 25, 1994.

*Primary Examiner*—Ayaz R. Sheikh
*Assistant Examiner*—David A. Wiley
*Attorney, Agent, or Firm*—Michael A. Rodriquez; Ronald C. Hudgens

[57] ABSTRACT

A computer system includes a housing, a motherboard, a first module and a second module. An electrical connector on the motherboard is joined to and in electrical communication with an electrical connector on one of two opposing surfaces of the first module, and an electrical connector on the second module is joined to and in electrical communication with another electrical connector on the other of the opposing surfaces of the first module. An electrically conductive path connects the two electrical connectors on the opposing surfaces of the first module. The motherboard transmits electrical signals corresponding to a module identifier to the first module through the motherboard's joined electrical connector. An electrical device on the first module in the electrically conductive path modifies the electrical signals so that they correspond to a second module identifier. The modified electrical signals corresponding to the second module identifier are transmitted to the second module via the electrically conductive path through the electrical connector on the first module that is joined to the electrical connector on the second module.

24 Claims, 15 Drawing Sheets

METHOD AND APPARATUS FOR INTERCONNECTION OF MULTIPLE MODULES

FIELD OF THE INVENTION

This invention relates generally to electrically interconnecting any number of modules within an electronic device enclosure, and, more particularly, to electrical signal communication between the modules using a computer system bus formed by the interconnection of modules.

BACKGROUND

Every computer system uses several busses as communication pathways interconnecting two or more electrical devices. Computer system makers have devised a myriad of system bus designs in an effort to produce a bus structure that anticipates system expansion, simplifies manufacturing, and makes efficient use of bus connections.

One bus design, commonly referred to as a backplane, produces a bus by running electrically conductive traces or paths along a motherboard. At designated locations along the bus, electrical bus connectors are mounted atop these traces so that the electrically conductive contacts of the bus connectors make electrical contact with the traces. Modules or circuit boards electrically and physically attach to the backplane by plugging into these bus connectors. All modules thus attached to the bus can electrically communicate with each other.

However, a backplane bus has some limitations. First, a backplane bus uses a substantial amount of a motherboard's surface area. Second, since a backplane bus is generally pre-configured to accommodate a specific number of plug-in modules, computer systems that require fewer than the allotted number of plug-in slots waste the unused bus connectors and valuable motherboard space. Third, those computer systems needing more than the allotted number of plug-in slots are subsequently limited. Lastly, because a backplane bus normally has electrical signal paths that are common to every module plugged into the bus, for the bus to support discrete electrical signal paths among modules generally requires handcrafting. However, the customizing of the electrical signal paths by cutting traces during manufacturing adds cost, and is difficult to reverse in the event of error.

Another class of bus designs produces busses without a backplane. These busses are formed by stacking together circuit boards or modules in modular fashion, joining each board or module to the next one by the electrical connectors mounted thereon. The electrical contacts of these electrical connectors perpetuate the electrical signal paths from module to module, and, in some cases, form part or all of the electrical signal paths themselves. Their modular construction allows the busses to expand or contract as the computer system requires, dispensing with any limiting or wasteful predetermined number of bus connectors.

Nevertheless, the type of electrical connectors used to interconnect the modules introduce their own particular limitations. One example of a commonly used electrical connector for a backplane-less bus is the through-hole connector. Because the pins of through-hole connectors completely penetrate the module, two through-hole connectors cannot be mounted on opposite sides of the module, directly opposite each other, without their pins interfering with each other. Therefore, for two through-hole connectors to be mounted on opposite sides of the module, they need to be staged so that they are unaligned or offset from each other. This uses more module surface area.

An alternative type of electrical connector is a stackable through-hole connector, which is male on one side and female on the other. Modules with these connectors are stacked thus: the male portion or pins of a first stackable connector penetrates the module, with the female portion of a second stackable connector receiving the pins on the module's other side; then the pins of the second stackable connector penetrate a second module, with the female portion of a third stackable connector receiving them on the second module's other side; and so on. However, trying to secure the stackable connector to the module causes difficulties. For one, soldering the stackable connector to a module might coat the pins with solder and make them too thick to be received by a female portion. Therefore, instead, the female portion of the stackable connector is typically force-fit onto the pins. The drawback of force-fitting, however, is that it has produced unreliable interconnections.

Moreover, a bus implementation using such stackable connectors causes every electrical signal path to be commonly shared by each module attached to the bus. Accordingly, this implementation cannot support discrete electrical signal paths to each module without significant hand-crafting at manufacturing. Yet, without this capability, the variety of bus configurations that can be implemented by an interconnected stack of modules is greatly limited.

For the foregoing reasons, there is need for an improved module interconnection that can produce a communication bus for a computer system which provides for discrete electrical signal paths, yet avoids the problems of the aforementioned approaches.

SUMMARY OF THE INVENTION

An object of the invention is to implement a computer system bus by interconnecting modules without the use of a backplane.

Another object of the invention is for any bus implementation to be able to support discrete electrical signal paths to each module that is a part of the bus without the need for customized module manufacturing.

Another object of the invention is reliable interconnection among the modules that makes efficient use of module and computer system space.

In a broad sense, the present invention includes a first circuit board and two electrical connectors, one on each of the opposite sides of the first circuit board. An electrically conductive path connects the two electrical connectors. Further, each of the two electrical connectors is for joining to and electrically communicating with an associated electrical connector on another circuit board. Therefore, when the two electrical connectors on the first circuit board are joined to associated electrical connectors on other circuit boards, electrical signals received by one of the two electrical connectors from the associated electrical connector joined thereto are supplied to the other associated electrical connector through the other of the two electrical connectors via the electrically conductive path. Also, an electrical device is in the electrical path between the two electrical connectors on the first circuit board, and acts upon the electrical signals that are transmitted through it.

In one embodiment, the electrical device modifies the electrical signals before they are passed from the first circuit board to an associated circuit board. This modifying of the electrical signals enables the transmission of unique electrical signals to that associated circuit board. When this feature is available to each circuit board that is a part of the bus, then each circuit board receives its own unique electrical signals.

Each circuit board then uses its unique electrical signals to identify discrete electrical signal paths in the computer system bus that are designated for that circuit board. Another feature of the invention is to have the two electrical connectors on the opposite sides of the first circuit board so that they are aligned opposite to each other.

In another embodiment, the invention includes a circuit board with two opposing surfaces. On each of the two opposing surfaces is an electrical connector having an electrically conductive contact that is secured at that surface. The two electrically conductive contacts are laterally offset from each other and electrically connected to each other by an electrically conductive path. In one embodiment, the two electrical connectors are aligned opposite to each other. Thus, the invention makes possible electrically conductive paths between electrically conductive contacts that are not necessarily opposite each other on opposing surfaces of the circuit board. Because of this flexibility, those bus configurations that need to change the relative contact position within an electrical connector of electrical signals as they are transmitted from one electrical connector on the circuit board to the next, can be implemented.

The invention offers several significant advantages. For one, the invention allows for efficient use of circuit board and computer system space and resources. Moreover, the invention enables the implementation of a wide variety of bus configurations without using a backplane because it provides for discrete electrical signal paths to each module that is part of the bus. Also, system bus expansion is not limited to a preconfigured number of bus connectors, nor are bus connectors wasted should the number of desired modules be less than that preconfigured number. Further, vertical and horizontal stacks of interconnected modules are both configurable within a computer system.

Other objects, features, and advantages of the present invention will become apparent in the course of the following description and by reference to the accompanying drawings.

DETAILED DESCRIPTION

Figure 1:
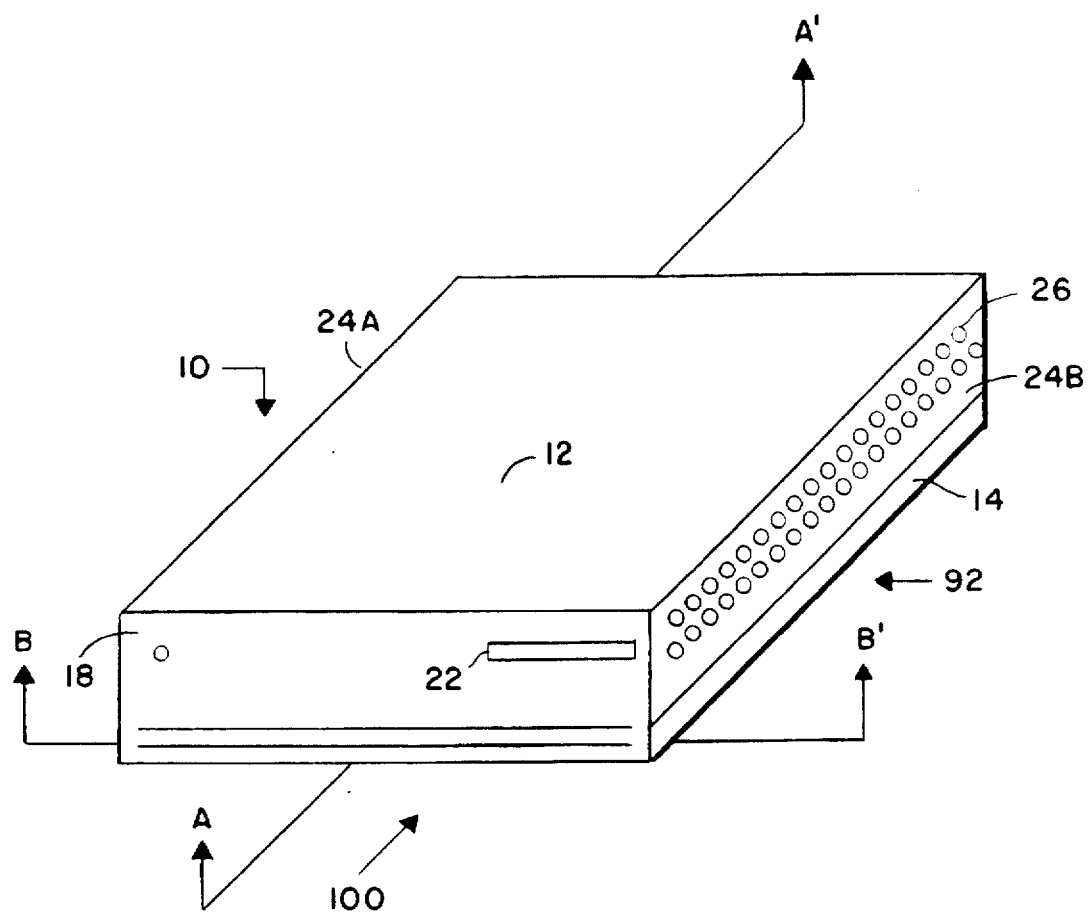
FIG. 1 is a isometric view of a computer system that incorporates a module stack embodying the principles of the present invention.
Figure 2:
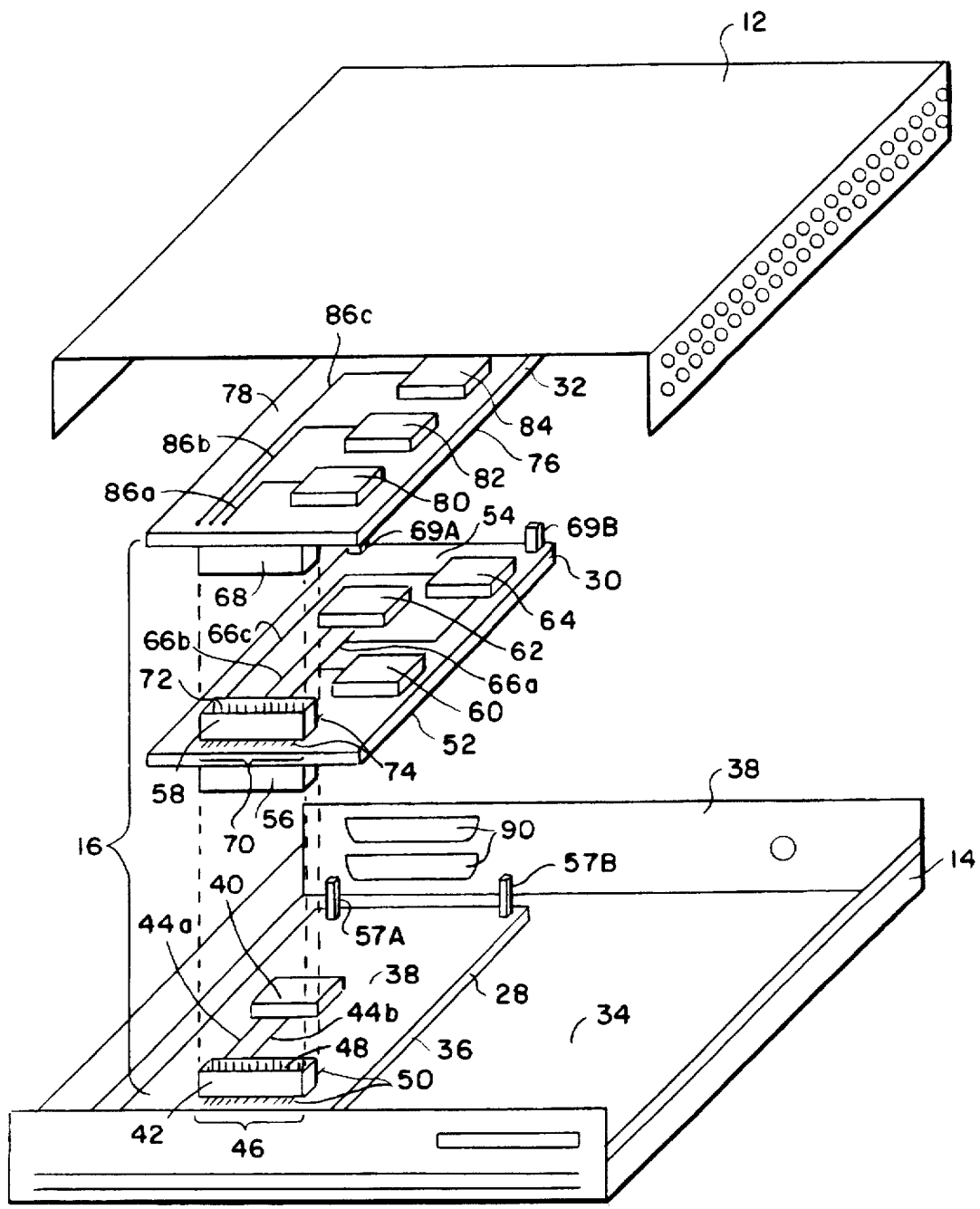
FIG. 2 is an exploded isometric assembly view of the computer system and the module stack.

FIG. 1 shows an isometric view of a computer system 10 that comprises an upper chassis 12 and a lower chassis 14, and incorporates a vertical module stack 16 (see FIG. 2). Computer system 10 has front wall 18 with horizontal slits 20 for venting heat that emanates from the electronic devices housed within. Front wall 18 also has slot 22 for receiving a storage device, such as a 3.5" diskette. Upper chassis 12 has side walls 24a, 24b that have holes 26 for additional heat venting.

Referring now to FIG. 2, the exploded view of computer system 10 reveals the vertical stack 16 of modules, shown as three circuit boards 28, 30, 32. Each circuit board in the module stack 16 is disposed substantially parallel to adjacent circuit boards. The bottom circuit board 28 has two major opposing surfaces 36, 38, and is removably secured to base 34 of the lower chassis 14 by any suitable fastening means. As a result, major surface 36 abuts base 34. Major surface 38 carries a central processor 40, an electrical connector 42, and electrically-conductive traces 44a, 44b, which electrically connect the central processor 40 to the electrical connector 42 for conducting electrical signals between them.

Electrical connector 42 is a receptacle or female surface mount connector, such as the commercially available model 52602-0509 50 circuit receptacle connector manufactured by Molex, and comprises a contact region 46 and mating region 48. As shown, contact region 46 has electrically-conductive leads (or electrical contacts) 50 that emanate from the electrical connector 42 and are on major surface 38. Leads 50 are secured on major surface 38 by soldering, and are electrically connected to electrically conductive traces thereon, including traces 44a, 44b. Each of the leads 50 extends into the mating region 48 of electrical connector 42 and has a numbered position therein.

The intermediate circuit board 30 shown in FIG. 2 has two major opposing surfaces 52, 54, and is interposed between circuit boards 28, 32. As shown, major surface 52 of the intermediate circuit board 30 faces major surface 38 of the bottom circuit board 28, and carries electrical connector 56. Electrical connector 56 is a plug or male surface mount connector, such as the commercially available model 53408-0509 50 circuit plug connector manufactured by Molex, and is for joining to and electrically communicating with associated electrical connector 42 on the bottom circuit board 28 to conduct electrical signals therebetween. Electrical connector 42 is associated with electrical connector 56 because it physically mates and electrically communicates with electrical connector 56 when the bottom circuit board 28 and the intermediate circuit board 30 are joined. Each of the leads 50 of the electrical connector 42 corresponds to that lead 105 (see FIG. 7) of the electrical connector 56 which occupies the same numbered position in electrical connector 56 as its own numbered position in the electrical connector 42. When electrical connectors 42, 56 are joined, corresponding leads become electrically connected to each other. Mechanical spacers 57a, 57b, secured on major surface 38 of the bottom circuit board 28, attach to and support the intermediate circuit board 30.

On the other major surface 54 of the intermediate circuit board 30 are electrical connector 58, three electrical devices 60, 62, 64, and electrically-conductive traces 66a, 66b, 66c. Electrical connector 58 is a receptacle or female surface mount connector, such as the commercially available model 52602-0509 50 circuit receptacle connector manufactured by Molex, and is for joining to and electrically communicating with associated electrical connector 68 on top circuit board 32 to conduct electrical signals therebetween. Electrical connector 68 is associated with electrical connector 58 because it physically mates and electrically communicates with electrical connector 58 when the intermediate circuit board 30 and the top circuit board 32 are joined. Mechanical spacers 69a, 69b, secured to major surface 54 of the intermediate circuit board 30, attach to and support the top circuit board 32. Electrical connector 58 comprises a contact region 70 and a mating region 72. Electrically-conductive leads (or electrical contacts) 74 in contact region 70 emanate from electrical connector 58. Leads 74 are secured on major surface 54 and electrically connected to electrically conductive traces, including 66a, 66b, 66c, by soldering.

Electrical devices 60, 62, 64 are each electrically connected to one of the leads 74 of electrical connector 58 by electrically conductive trace 66a for sending or receiving electrical signals thereon. Also, electrical device 62 is electrically connected to another of the leads 74 by the electrically-conductive trace 66b, and electrical device 64 is electrically connected to yet another of the leads 74 by electrically-conductive trace 66c for sending or receiving electrical signals thereon. Each of the leads 74 extends into mating region 72 of electrical connector 58 and occupies a numbered position therein (see FIG. 8). Each of the leads 74 of the female electrical connector 58 corresponds to that lead of the male electrical connector 56 which occupies the same numbered position in the male electrical connector as its own numbered position in the female electrical connector. Since electrical connectors 56, 58 are aligned, corresponding leads are directly opposite each other on opposing surfaces of intermediate circuit board 30.

The top circuit board 32 shown in FIG. 2 has two major opposing surfaces 76, 78. As shown, major surface 76 of the top circuit board 32 faces major surface 54 of intermediate circuit board 30 and carries electrical connector 68.

Electrical connector 68 is a plug or male surface mount connector, such as the commercially available model 53408-0509 50 plug connector manufactured by Molex, and is for joining to and electrically communicating with electrical connector 58 on the intermediate circuit board 30 to conduct electrical signals therebetween. Electrical connector 68 is associated with electrical connector 56 because it physically mates and electrically communicates with electrical connector 56 when the top circuit board 32 and the intermediate circuit board 30 are joined.

On the other major surface 78 of the top circuit board 32 are three electrical devices 80, 82, 84 and electrically-conductive traces 86a, 86b, 86c for conducting electrical signals thereon: electrical device 80 is electrically connected to trace 86a; electrical device 82 is electrically connected to trace 86b; and electrical device 84 is electrically connected to trace 86c. Traces 86a, 86b, 86c are electrically connected to electrical connector 68 through the top circuit board 32.

Lower chassis 14 of computer system 10 has a rear wall 88 that includes apertures 90 through which electrical devices on circuit boards 30, 32 electrically communicate with electrical devices that are external to computer system 10.

Figure 3:
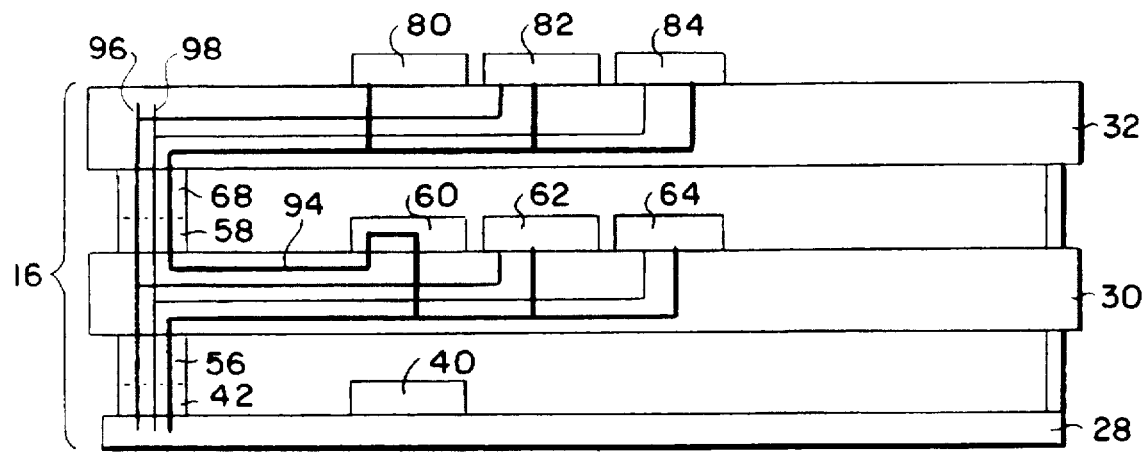
FIG. 3 is a cross-section side view along line AA' in FIG. 1 from the direction as indicated by arrow 92 of the module stack.

Referring now to FIG. 3, electrical connector 56 on intermediate circuit board 30 is shown joined to and in electrical communication with associated electrical connector 42 on bottom circuit board 28. Also, electrical connector 58 on intermediate circuit board 30 is joined to and in electrical communication with associated electrical connector 68 on top circuit board 32. An electrically conductive path 94 connects the two electrical connectors 56, 58 on intermediate circuit board 30 such that electrical signals received by electrical connector 56 from the associated electrical connector 42 on bottom circuit board 28 are supplied along the electrically conductive path 94 to the associated electrical connector 68 on top circuit board 32 through electrical connector 58 on the intermediate circuit board 30. Inversely, electrical signals received by electrical connector 58 from the associated electrical connector 68 on top circuit board 32 are supplied along the electrically conductive path 94 to the associated electrical connector 42 on bottom circuit board 28 through electrical connector 56 on the intermediate circuit board 30. The electrically-conductive path 94 includes electrically conductive trace 66a.

As shown, electrical device 60 is in the electrically conductive path 94 between the two electrical connectors 56 and 58 on the intermediate circuit board 30. Electrical device 60 responds to the electrical signals that are transmitted therethrough. Electrical devices 62 and 64 are electrically connected to electrically conductive path 94 via electrically-conductive trace 66a.

Also shown are electrically conductive paths 96 and 98 traversing through the module stack 16. Electrical devices 62, 64 are electrically connected to electrically conductive paths 96, 98, respectively, via electrically conductive traces 66b, 66c, respectively (also see FIG. 2).

Figure 4:
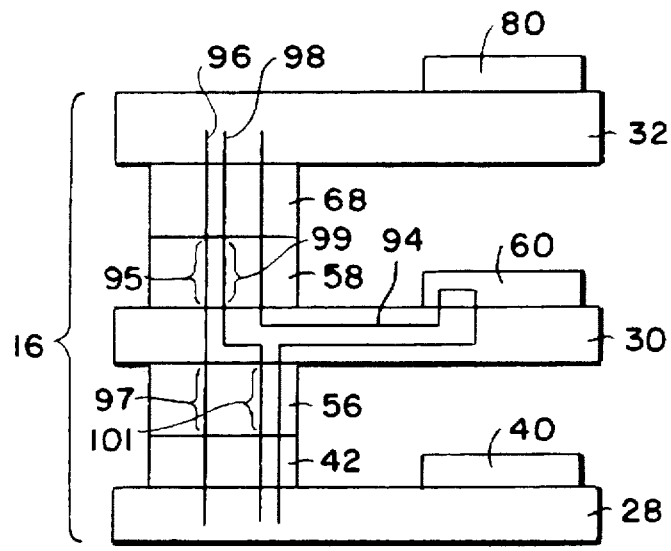
FIG. 4 is a cross-section front view along line BB' in FIG. 1 from the direction as indicated by arrow 100 of the module stack.

Referring now to FIG. 4, the electrical connectors 42, 56, 58, 68, of stacked circuit boards 28, 30 and 32 are joined as described in the discussion of FIG. 3. Electrically conductive path 96 is shown connecting lead 95 of electrical connector 58 and corresponding lead 97 of electrical connector 56. Lead 95 corresponds to lead 97 because the numbered position in electrical connector 58 occupied by lead 95 is the same as the numbered position in electrical connector 56 occupied by lead 97. Electrically conductive path 98 is shown connecting lead 99 of electrical connector 58 and lead 101 of electrical connector 56. Leads 99, 101 do not correspond because they occupy different numbered positions within their respective electrical connectors.

Figure 5:
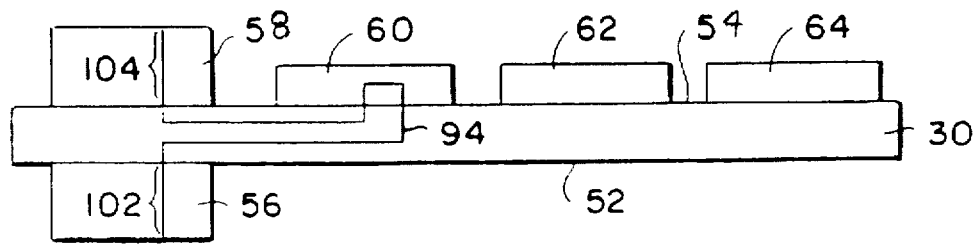
FIG. 5 is a cross-section side view along line AA' in FIG. 1 of the intermediate circuit board having two electrical connectors thereon in alignment, an electrically conductive path between the two electrical connectors, and an electrical device in the electrically conductive path.

Referring now to FIG. 5, intermediate circuit board 30 is shown having electrical connector 56 on major surface 52. Electrical connector 56 has an electrically conductive lead 102, which is secured at major surface 52 and occupies a numbered position within electrical connector 56.

On the opposing major surface 54 of intermediate circuit board 30 is electrical connector 58, which is shown to be in alignment with electrical connector 56. Electrical connector 58 has electrically conductive lead 104 that is secured on major surface 54, and occupies a numbered position within connector 58. Electrically conductive path 94 electrically connects electrically conductive leads 104 and 102. As shown, electrical device 60 is in the electrically conductive path 94 between electrical connectors 56, 58.

Figure 6:
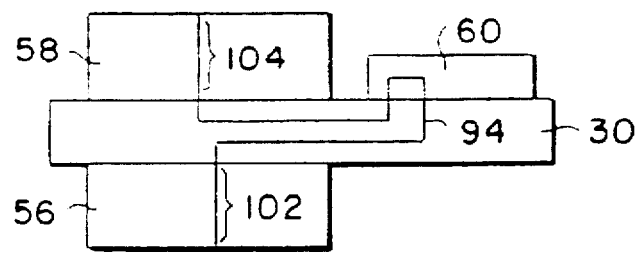
FIG. 6 is a cross-section front view along line BB' in FIG. 1 of the intermediate circuit board having two electrical connectors thereon in alignment, an electrically conductive path between the two electrical connectors, and an electrical device in the electrically conductive path.

Referring now to FIG. 6, a front view of the intermediate circuit board 30 shows electrical connector 58 to be in alignment with electrical connector 56, and electrically conductive lead 104 to be laterally offset from electrically conductive lead 102. Leads 102, 104 do not correspond because they occupy different numbered positions within their respective electrical connectors.

Figure 7:
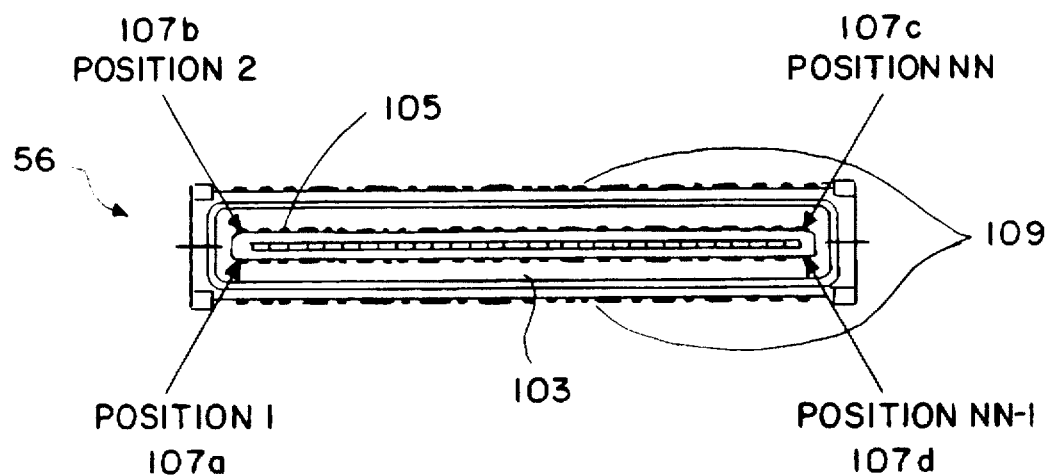
FIG. 7 is an overhead view of a male surface mount electrical connector.

Referring now to FIG. 7, a detailed view of electrical connector 56 on intermediate circuit board 30 is shown looking into the mating region 103 of the electrical connector 56. Each of the leads 105 of the electrical connector 56 occupies a numbered position, such as numbered positions 107a–d, within mating region 103, and extends to the contact region 109 of the electrical connector 56.

Figure 8:
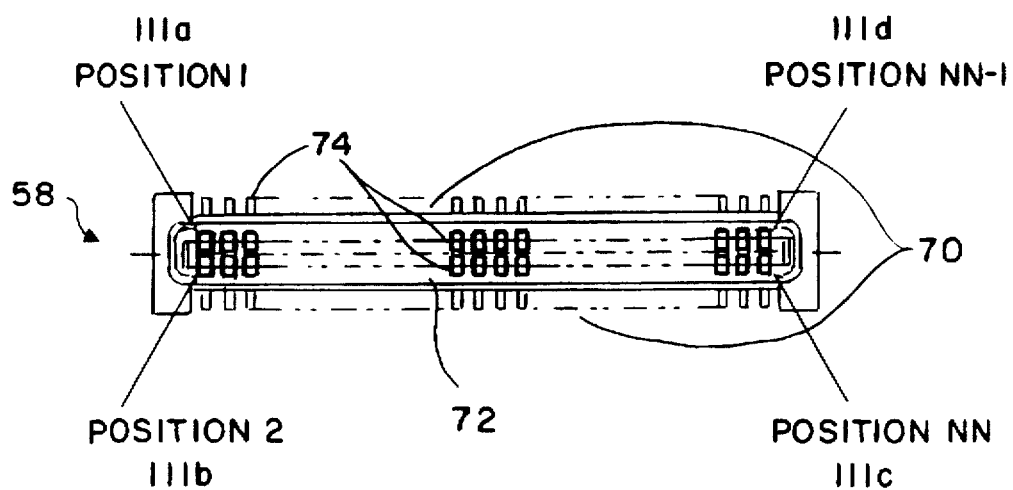
FIG. 8 is an overhead view of a female surface mount electrical connector.

Referring now to FIG. 8, a detailed view of electrical connector 58 on intermediate circuit board 30 is shown looking into the mating region 72 of the electrical connector 58. Each of the leads 74 of the electrical connector 58 occupies a numbered position, such as numbered positions 111a–d, within mating region 72, and extends to the contact region 70 of the electrical connector 58.

In other embodiments in which opposing surfaces of a circuit board each have a male electrical connector, each of the leads of one male electrical connector corresponds to that lead of the other male electrical connector which occupies the numbered position that is across from the same numbered position in the other male electrical connector as its own numbered position. For example, referring to FIG. 7, position 2 is across from position 1 in electrical connector 56, thus a lead in position 2 of a male electrical connector corresponds to a lead in position 1 of another male connector that is on the opposite side of a circuit board.

In other embodiments in which opposing surfaces of a circuit board each have a female electrical connector, each of the leads of one female electrical connector corresponds to that lead of the other female electrical connector which occupies the numbered position that is across from the same numbered position in the other female electrical connector as its own numbered position. For example, referring to FIG. 8, position 2 is across from position 1 in electrical connector 58, thus a lead in position 2 of a female electrical connector corresponds to a lead in position 1 of another female connector that is on the opposite side of a circuit board.

FIGS. 1–8 show a particular embodiment that incorporates the principles of the invention. Other embodiments can have, for example, a module stack with more or fewer than three circuit boards, as appropriate. Also, the circuit boards in a module stack can be stacked horizontally rather than vertically. Moreover, electrical connectors can be anywhere on the major surface of the circuit boards, and the electrical devices and electrically conductive traces can be on either major surface of a circuit board. Further, the electrical connectors on an intermediate circuit board can be both male connectors or both female connectors.

Figure 9:
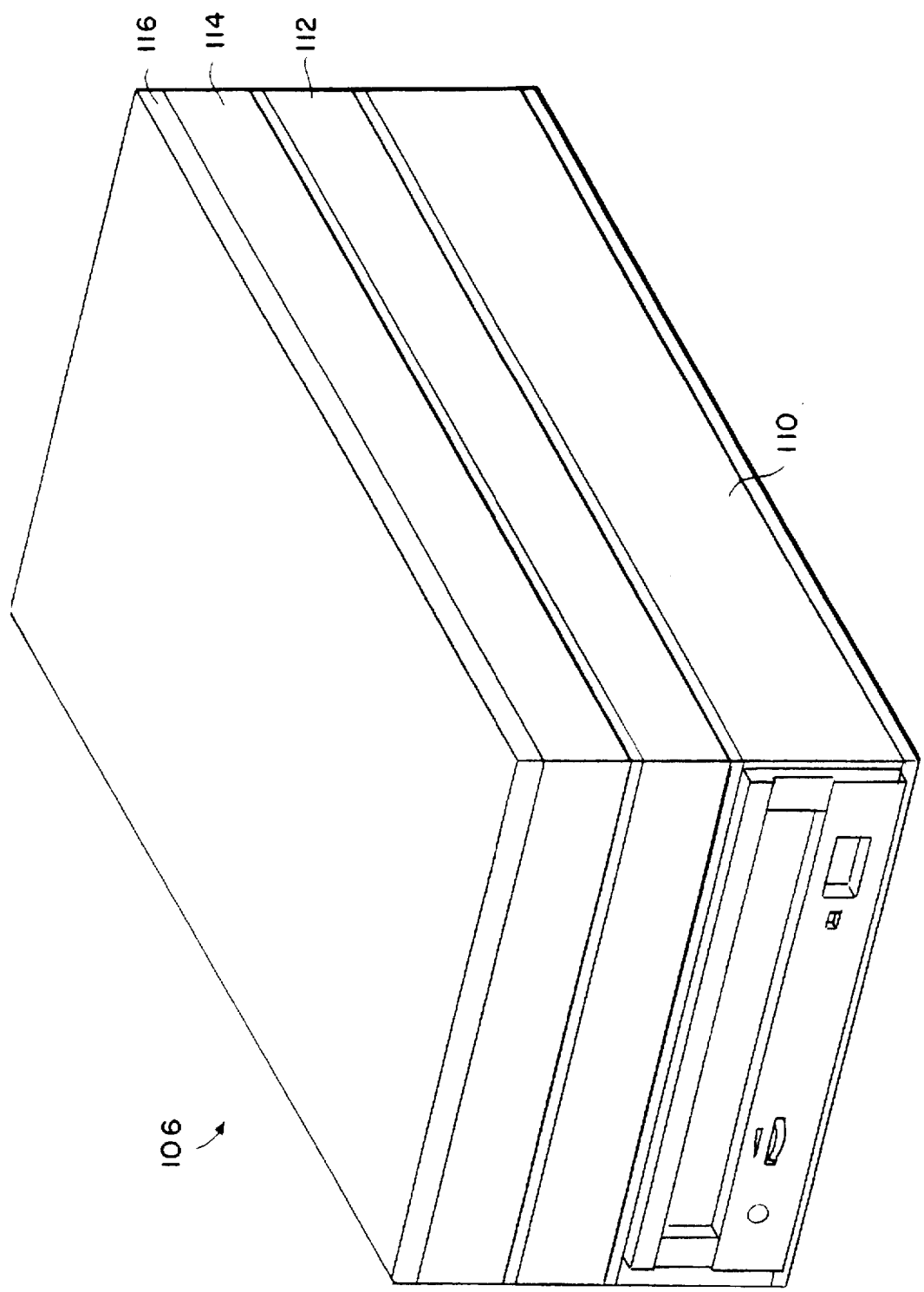
FIG. 9 is a isometric view of an alternative computer system that incorporates the principles of the present invention.

Referring now to FIG. 9, a front view of an alternative computer system 106 is shown comprising three modules, drawn as stacked system blocks 110, 112, 114, and a trim block 116. System blocks 112, 114 are constructed so that their positions in the stack of system blocks are interchangeable. The stack of blocks can be expanded to include more interchangeable system blocks of similar construction. These additional blocks can be inserted anywhere between the trim 116 and the bottom system block 110, in accordance to the requirements of the computer system being configured. For illustration purposes, the system blocks 110, 112, 114 are shown to have equal widths and lengths, so as to present an aesthetic computer system design, but other embodiments could interconnect system blocks of unequal lengths and widths.

Figure 10:
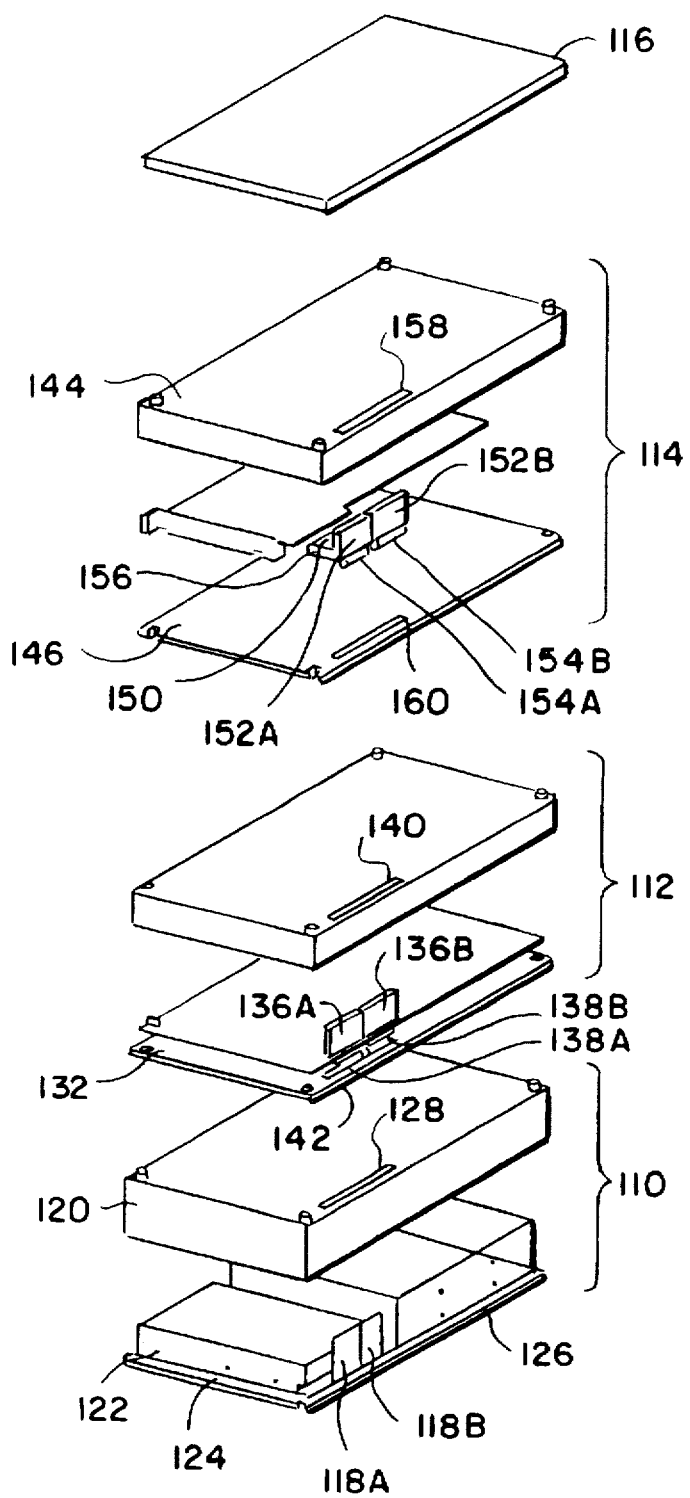
FIG. 10 is an exploded isometric assembly view of the alternative computer system.

Referring now to FIG. 10, the exploded rear view of the alternative computer system 106 reveals the details of each system block 110, 112, 114. Bottom system block 110 includes two electrical connectors 118a–b, a cover 120, a base 122, and two electrical devices 124, 126. Cover 120 has a slit 128, through which the electrical connectors 118a–b extend when the cover 120 is joined to the base 122. Electrical devices 124, 126, which are secured to base 120, are a hard disk drive and a computer disk drive, respectively.

Middle system block 112, as shown, includes a cover 130, a base 132, a logic board 134, and four electrical connectors 136a–b, 138a–b. Electrical connectors 136a–b are surface mounted on an opposing surface of logic board 134 than electrical connectors 138a–b. Cover 130 has a slit 140 through which the electrical connectors 136a–b extend when the cover 130 is joined to the base 132. Logic board 134, which is secured to base 130, and the electrical connectors 136a–b, 138a–b are subsequently enclosed. When middle system block 112 is stacked onto bottom system block 110, electrical connectors 138a–b extend through the slit 142 in the base 132 in order to join to and come into electrical communciation with electrical connectors 118a–b, respectively.

Also shown, top system block 114 includes a cover 144, a base 146, a PCI option card 148, a connector board 150, four electrical connectors 152a–b, 154a–b, and electrical edge connector 156. Electrical connectors 152a–b are surface mounted on an opposing surface of connector board 150 than electrical connectors 154a–b. Also attached to an edge of connector board 150 is electrical edge connector 156, which is for connecting the connector board 150 to the PCI option card 148. Electrical edge connector 156 is electrically connected to the other electrical connectors 152a–b, 154a–b on the connector board 150. Cover 144 has a slit 158 through which the electrical connectors 152a–b extend when the cover 144 is joined to the base 146. PCI option card 148, which is secured to base 144, and the connector board 150 with the attached electrical connectors are subsequently enclosed. When top system block 114 is stacked onto middle system block 112, electrical connectors 154a–b extend through the slit 160 in the base 146 in order to join to and come into electrical communciation with electrical connectors 136a–b, respectively.

Trim block 116 completes the alternative computer system 106 by providing a cover for the slit 158 of the top system block 114.

Figure 11:
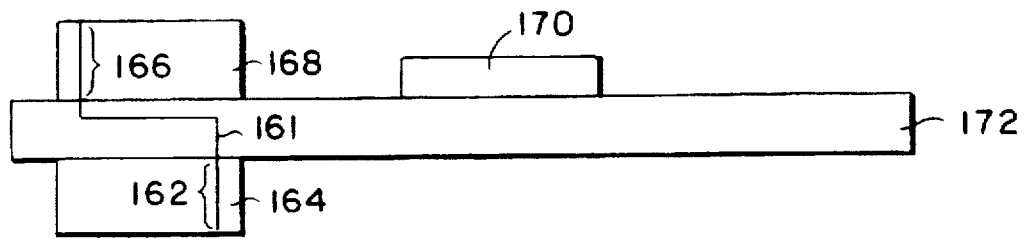
FIG. 11 is a cross-section side view, along a plane like the cross-section view of the intermediate circuit board in FIG. 5, of an alternative intermediate circuit board having the two electrical connectors thereon in alignment, an electrically conductive path between the two electrical connectors, and an electrical device that is not in the electrically conductive path.
Figure 12:
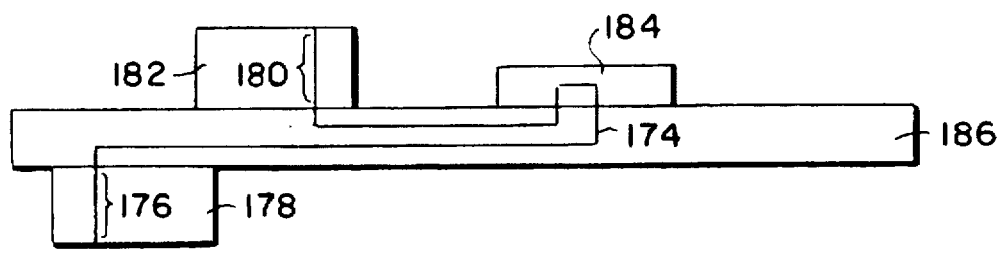
FIG. 12 is a cross-section side view, along a plane like the cross-section view of the intermediate circuit board in FIG. 5, of an alternative intermediate circuit board having two electrical connectors thereon that are not showing alignment, an electrically conductive path between the two electrical connectors, and an electrical device in the electrically conductive path.
Figure 13:
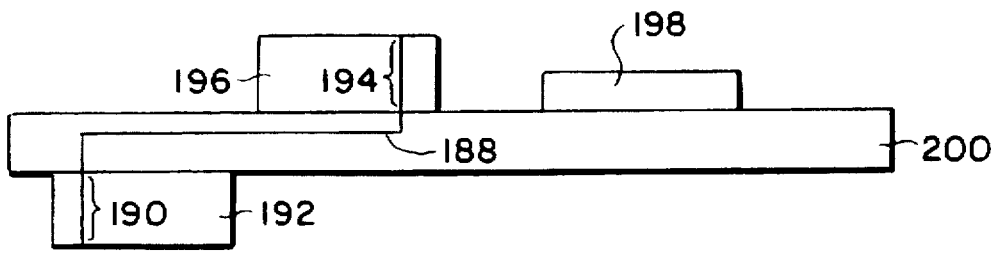
FIG. 13 is a cross-section side view, along a plane like the cross-section view of the intermediate circuit board in FIG. 5, of an alternative intermediate circuit board having two electrical connectors thereon that are not showing alignment, an electrically conductive path between the two electrical connectors, and an electrical device that is not in the electrically conductive path.

Referring now to FIGS. 11–13, alternative embodiments of an intermediate circuit board are shown from a side view along a plane like the side view of the intermediate circuit board in FIG. 5.

In FIG. 11, the electrically conductive path 161 connecting electrically conductive lead 162 of female electrical connector 164 and electrically conductive lead 166 of male electrical connector 168 does not extend through electrical device 170 on a surface of intermediate circuit board 172. As shown, electrical connectors 164, 168 are aligned with each other, and electrically conductive leads 162, 166 are laterally offset from each other. Leads 162, 166 do not correspond because they occupy different numbered positions within their respective electrical connectors.

In FIG. 12, the electrically conductive path 174 connecting electrically conductive lead 176 of male electrical connector 178 and electrically conductive lead 180 of male electrical connector 182 extends through electrical device 184 on a surface of intermediate circuit board 186. As shown, electrical connectors 178, 182 are not aligned with each other, and electrically conductive leads 176, 180 are laterally offset from each other. Leads 176, 180 do not correspond because lead 176 does not occupy a numbered position that is the same as the numbered position across from the numbered position occupied by lead 180 in the electrical connector 182.

In FIG. 13, the electrically conductive path 188 connecting electrically conductive lead 190 of female electrical connector 192 and electrically conductive lead 194 of female electrical connector 196 does not extend through electrical device 198 on a surface of intermediate circuit board 200. As shown, electrical connectors 192, 196 are not aligned with each other, and electrically conductive leads 190, 194 are laterally offset from each other. Leads 190, 194 do not correspond because lead 190 does not occupy a numbered position that is the same as the numbered position across from the numbered position occupied by lead 194 in the electrical connector 196.

Figure 14:
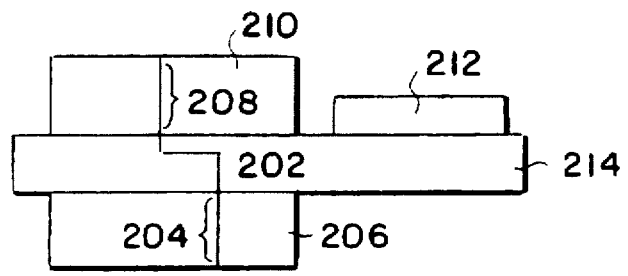
FIG. 14 is a cross-section front view, along a plane like the cross-section front view of the intermediate circuit board in FIG. 6, of an alternative intermediate circuit board having two electrical connectors thereon in alignment between, an electrically conductive path between the two electrical connectors, and an electrical device that is not in the electrically conductive path.
Figure 15:
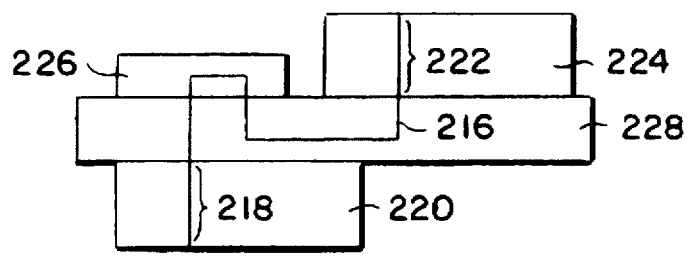
FIG. 15 is a cross-section front view, along a plane like the cross-section front view of the intermediate circuit board in FIG. 6, of an alternative intermediate circuit board having two electrical connectors thereon that are not showing alignment, an electrically conductive path between the two electrical connectors, and an electrical device in the electrically conductive path.
Figure 16:
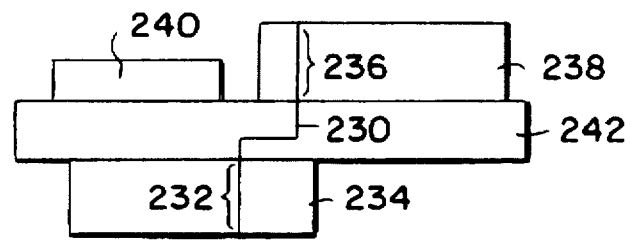
FIG. 16 is a cross-section front view, taken along a plane like the cross-section front view of the intermediate circuit board in FIG. 6, of an alternative intermediate circuit board showing two electrical connectors thereon without alignment and an electrically conductive path that does not go through the shown electrical device.

Referring now to FIGS. 14–16, alternative embodiments of an intermediate circuit board are shown from a front view along a plane like the front view of the intermediate circuit board in FIG. 6.

In FIG. 14, the electrically conductive path 202 connecting electrically conductive lead 204 of male electrical connector 206 and electrically conductive lead 208 of female electrical connector 210 does not extend through electrical device 212 on a surface of intermediate circuit board 214. As shown, electrical connectors 206, 210 are aligned with each other, and electrically conductive leads 204, 208 are laterally offset from each other. Leads 204, 208 do not correspond because they occupy different numbered positions within their respective electrical connectors.

In FIG. 15, the electrically conductive path 216 connecting electrically conductive lead 218 of female electrical connector 220 and electrically conductive lead 222 of female electrical connector 224 extends through electrical device 226 on a surface of intermediate circuit board 228. As shown, electrical connectors 220, 224 are not aligned with each other, and electrically conductive leads 218, 222 are laterally offset from each other. Leads 218, 222 do not correspond because lead 218 does not occupy a numbered position that is the same as the numbered position across from the numbered position occupied by lead 222 in the electrical connector 224.

In FIG. 16, the electrically conductive path 230 connecting electrically conductive lead 232 of male electrical connector 234 and electrically conductive lead 236 of male electrical connector 238 does not extend through electrical device 240 on a surface of intermediate circuit board 242. As shown, electrical connectors 234, 238 are not aligned with each other, and electrically conductive leads 232, 236 are laterally offset from each other. Leads 232, 236 do not correspond because lead 232 does not occupy a numbered position that is the same as the numbered position across from the numbered position occupied by lead 236 in the electrical connector 238.

Implementation of a System Bus

A module stack like those described in FIGS. 1–16 can be used to implement various configurations of expandable computer system busses without using a backplane. In fact, a single module stack can concurrently support multiple unrelated or related computer system busses, such as memory busses, PCI busses, SCSI busses, and expansion busses. These busses may interconnect a full range of electrical devices, including memory boards, video devices, i/o devices, SCSI controllers and other peripherals. A module can incorporate one or more of these electrical devices and be constructed so that it can occupy any position within the module stack. A module's eventual position in a module stack may be determined by the particular bus that is being configured and the type of functions that are performed by the electrical device(s) it contains.

Computer system busses employ various numbers and types of bus signal lines. Some of these bus signal lines, such as address and data signals, may be shared by all modules attached to the bus, while other bus signal lines, such as bus grant signals, may be daisy-chained from one module to the next. Selecting electrical connectors of the type shown in FIGS. 1–16 that have an appropriate number of leads can accommodate the variation in the number of bus signal lines. The principles of the invention as shown in FIGS. 1–16 can accommodate bus signal lines that are not shared by all devices attached to a particular bus, such as, for example, daisy-chained signals.

Implementation of a Bus with Daisy-chained Bus Signal Lines

Figure 17:
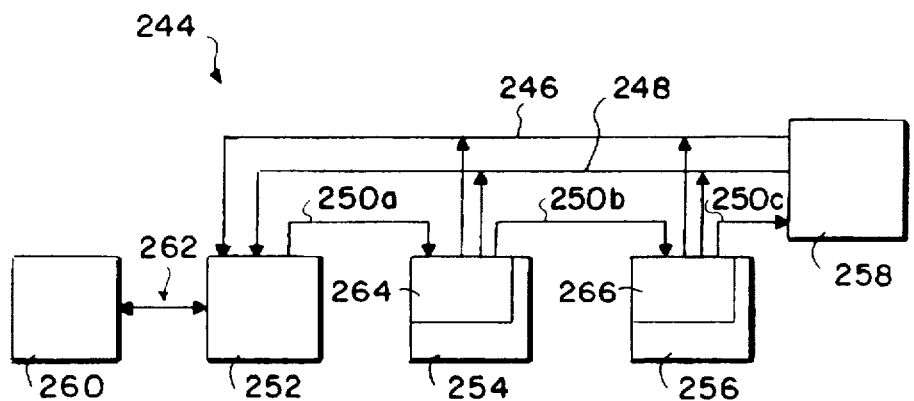
FIG. 17 is a block diagram of an Unibus arbitration section.

An example of a bus that uses daisy-chained bus signal lines is the Unibus. In FIG. 17, a simplified diagram of a Unibus arbitration section is shown, taken from page 282 of *Computer Engineering* by C. Gordon Bell et al., published in 1978 by Digital Press, Bedford, Mass. The Unibus 244 comprises two shared bus signal lines, the bus request line 246 and the selection acknowledge (SACK) signal line 248, and daisy-chained grant signal lines 250a, 250b and 250c. Connected to the Unibus 244 is an arbitration device 252, two controller devices 254, 256, and a bus terminating device 258. A central processor (CPU) 260 is connected to the arbitration device 252 by signal line 262. Whenever either controller device 254 or device 256 wants to use the Unibus 244 for a bus transaction, it asserts the shared bus request line 246. When the CPU 260 is able to receive an interruption, the arbitration device 252 asserts the bus grant signal line 250a. Controller device 254 has arbitration logic 264 that responds to the assertion of the bus grant signal line 250a. Arbitration logic 264 acknowledges receipt of the asserted bus grant signal by asserting the SACK signal line 248. If controller device 254 has asserted the bus request line 246, the arbitration logic 264 uses the asserted bus grant signal to initiate a bus transaction. Otherwise the arbitration logic 264 responds by asserting the bus grant signal line 250b. The bus grant signal on bus grant signal line 250b is received by the next controller device 256 in the daisy-chain. Controller device 256 also has arbitration logic 266, which operates like arbitration logic 264.

Figure 18:
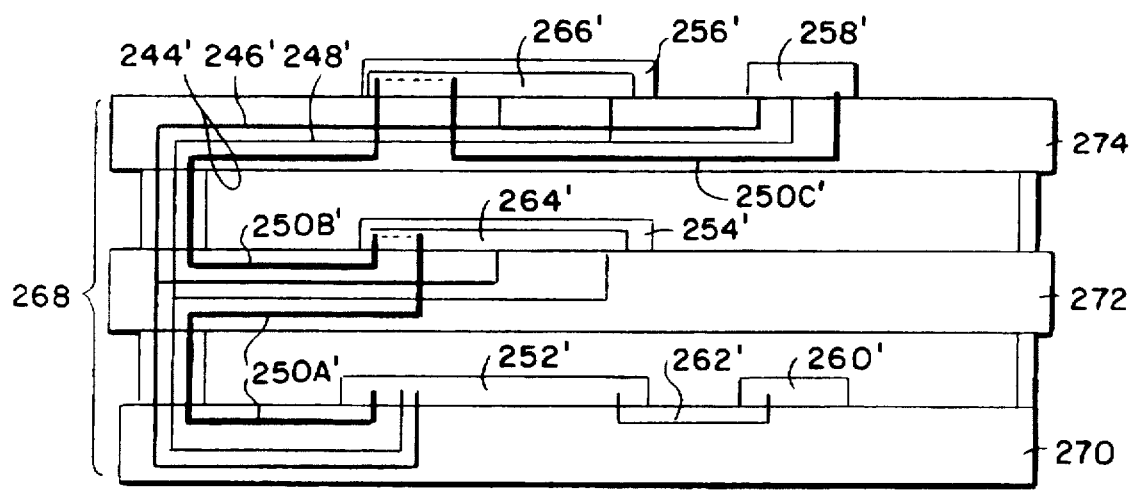
FIG. 18 is a side view of an embodiment of a module stack that implements the Unibus arbitration section according to the principles of the present invention.

Referring now to FIG. 18, the elements are numbered the same as corresponding elements in FIG. 17, with an additional prime (') mark. In FIG. 18, the arbitration section of the Unibus 244' is shown as it may be implemented in a module stack 268' using the principles of the present invention. The bottom circuit board 270' comprises the arbitration device 252' and the CPU 260'; the intermediate circuit board 272' comprises the controller device 254'; and the top circuit board 274' comprises the controller device 256' and terminating device 258'. The Unibus 244' comprises the two shared bus signal lines 246', 248', and daisy chained bus signal lines 250a', 250b', 250c'. Arbitration device 252', controller devices 254', 256', and the terminating device 258' are shown connected to the Unibus bus 244'. Controller device 254' comprises arbitration logic 264', and controller device 256' comprises arbitration logic 266'. The CPU 260' is shown connected to the arbitration device 252' by signal line 262'. The manner of arbitrating between the controller devices 254', 256' is unchanged from that described in the discussion of FIG. 17.

Implementation of a System Bus with Dedicated Bus Signal Lines

Some bus configurations have bus signal lines that are dedicated for communication between a motherboard (or host adapter) and a particular module attached to the bus. In a module stack, these dedicated bus signal lines may pass through intervening modules before reaching the intended module. Also, because modules can be generically manufactured without regard to their final stack position in the module stack, they may not necessarily be pre-configured to connect to any particular dedicated bus signal lines. Therefore, each module within a module stack needs to determine which dedicated bus signal lines are designated for it.

This is achieved by sending each module within a module stack a unique identifier. Each module uses its identifier to select which dedicated bus signal lines that module may use. Once a module has its identifier, it may send and receive electrical signals on those dedicated bus signal lines that have been designated for the position in the module stack that the module occupies.

Implementation of a Module Identifier

Figure 19:
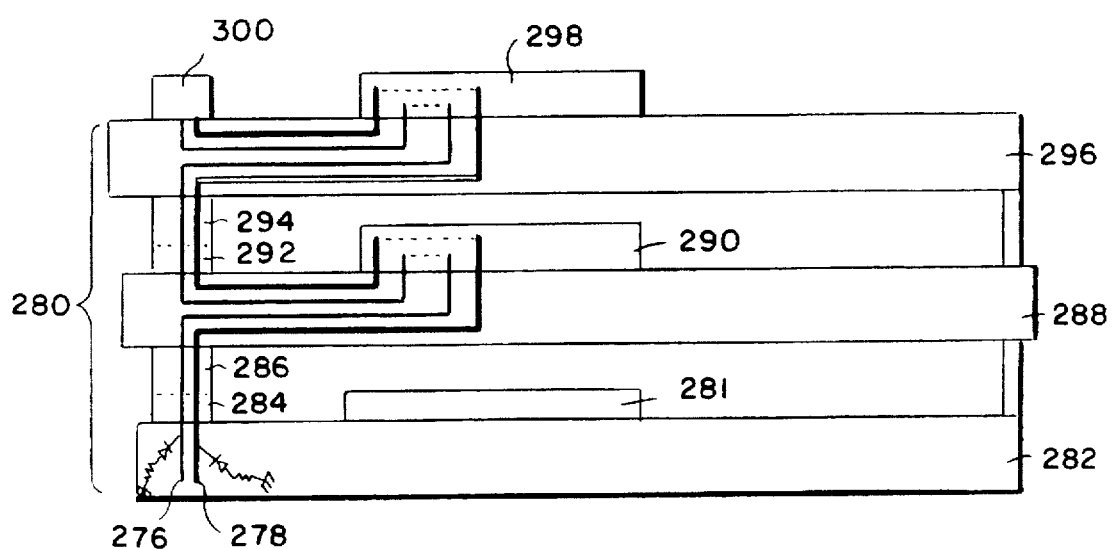
FIG. 19 is a side view of an embodiment of a module stack that implements transmitting module identifiers according to the principles of the present invention.

Referring now to FIG. 19, another embodiment is shown having two electrically-conductive paths or bus signal lines 276, 278. Bus signal lines 276, 278 are for carrying electrical signals to each circuit board in module stack 280. The electrical signals carried by the two bus signal lines 276, 278 correspond to a module identifier, and can represent up to four unique stack positions within module stack 280. Using fewer or more bus signal lines will reduce or increase, respectively, the number of stack positions in a module stack that can be uniquely identified by the bus signal lines. For example, three bus signal lines for the module identifier can represent up to eight unique positions in the module stack.

In FIG. 19, bus signal lines 276, 278 are shown to originate from the bottom circuit board 282. Because the bus signal lines 276, 278 at bottom circuit board 282 are each tied to ground (0 volt level) through a diode and a resistor, the electrical signals on the bus signal lines 276, 278 correspond to a binary module identifier of "00". Bus signal line 276 carries the least significant bit of the binary module identifier. The bus signal lines can also originate from sources other than ground, such as, for example, CPU device 281, and the electrical signals on the bus signal lines can correspond initially to binary module identifiers other than "00".

From bottom circuit board 282, bus signal lines 276, 278 carry the electrical signals through the joined connectors 284, 286 to intermediate circuit board 288. Electrical device 290 on intermediate circuit board 288 is in the paths of bus signal lines 276, 278, and responds to the electrical signals carried thereon by modifying them. Once modified, the electrical signals correspond to a different module identifier than when they were received by electrical device 290. In this embodiment, electrical device 290 includes an adder component that increments the module identifier represented by the electrical signals it receives, making the electrical signals on bus signal lines 276, 278 correspond to binary module identifier "01" when leaving electrical device 290. The voltage level carried by bus signal line 276 has been changed from 0 volts to a level that indicates a "1" value, whereas the voltage level on bus signal line 278 has remained unchanged at 0 volts.

From electrical device 290 on intermediate circuit board 288, the bus signal lines 276, 278 carry the modified electrical signals through the joined connectors 292, 294 to top circuit board 296. Electrical device 298 on top circuit board 296 is in the paths of bus signal lines 276, 278, and responds to the electrical signals carried thereon by modifying them. The twice-modified electrical signals then correspond to a different module identifier than when they were received by electrical device 298. In this embodiment, electrical device 298 includes an adder component that increments the module identifier represented by the electrical signals it receives, making the electrical signals on bus signal lines 276, 278 correspond to binary module identifier "10" when leaving electrical device 298. The voltage level carried by bus signal line 278 has been changed from 0 volts to a level that indicates a "1" value, while the voltage level indicative of a "1" value carried by bus signal line 276 has changed to 0 volts. The electrical signals on bus signal lines 276, 278 are then supplied to electrical connector 300.

In another embodiment, another circuit board may be joined to top circuit board 296 by electrical connector 300. In similar fashion to electrical devices 290, 298, an electrical device on this circuit board can produce the remaining unique module identifier, "11", that can be fashioned using two bus signal lines. In other embodiments, electrical devices 290, 298 can modify the binary module identifier, as represented by the electrical signals, in ways other than by incrementing. For example, decrementing works as well, just so long as each electrical device produces a binary module identifier that is different from the binary module identifier it received and is uniquely identifies a circuit board in the module stack.

Receiving Inputs on Dedicated Bus Signal Lines

One particular bus configuration, the Peripheral Component Interconnect (PCI) bus, requires that a unique address signal be directed into the IDSEL input of each PCI device attached to the PCI bus. Because modules may be generically manufactured without regard to their final stack position in the module stack, they might not be pre-configured to receive any particular dedicated address signal. Thus, a module within a module stack uses its module identifier to determine which address signal to direct to the IDSEL input of its PCI device.

Figure 20:
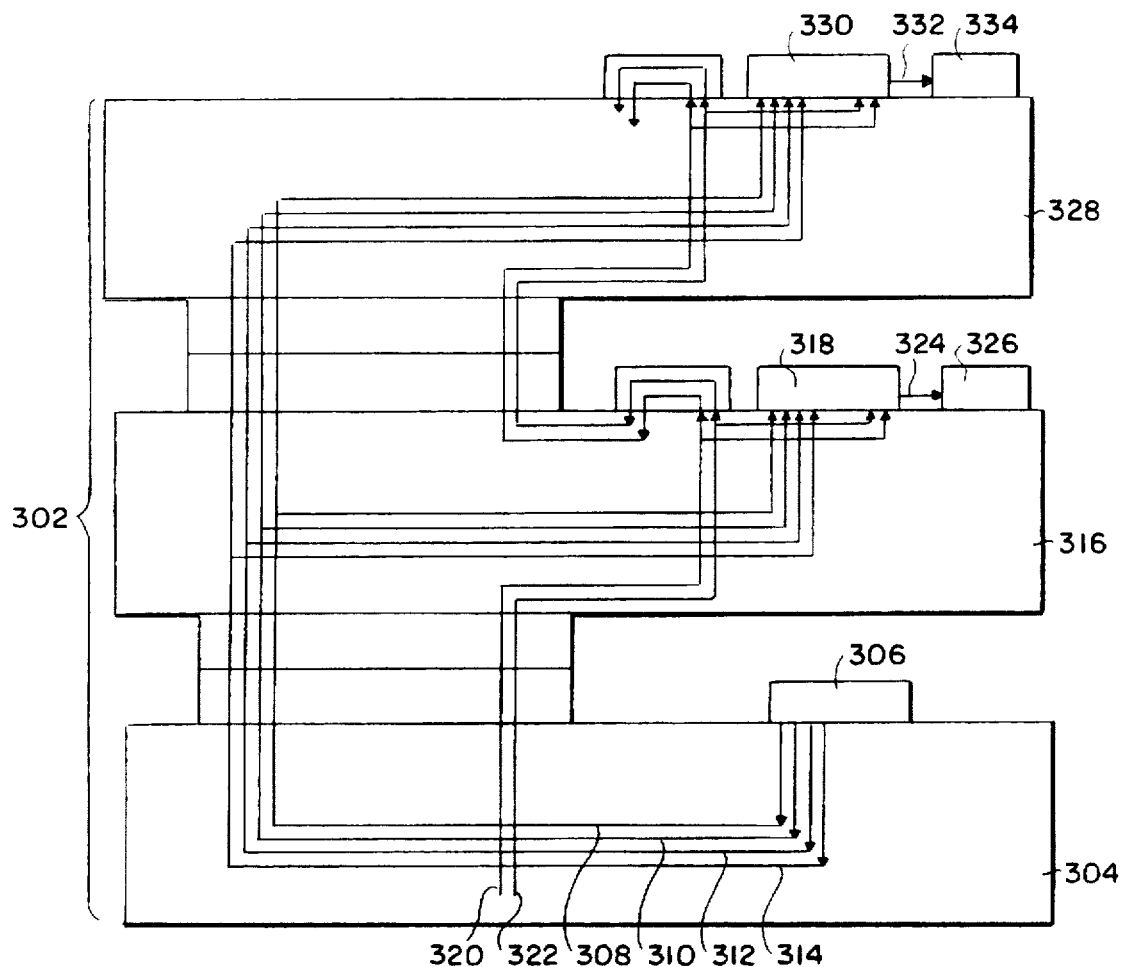
FIG. 20 is a side view of an embodiment of a module stack that implements dedicated input bus signal lines according to the principles of the present invention.

Referring now to FIG. 20, an implementation of a portion of a PCI bus on the module stack 302 is shown using the principles of the present invention so that a unique address signal can be directed into the IDSEL input of each circuit board within the module stack that has a PCI device.

In FIG. 20, bottom circuit board 304 is shown having an electrical device 306 that sends address signals on bus signal lines 308, 310, 312, 314. Intermediate circuit board 316 is shown having an electrical device 318 that receives bus signal lines 308, 310, 312, 314. Electrical device 318 also receives the electrical signals corresponding to the binary module identifier for intermediate circuit board 316 on bus signal lines 320, 322. Electrical device 318 includes a multiplexer component which selects one of the bus signal lines 308, 310, 312, 314 as indicated by the binary module identifier received on bus signal lines 320, 322, and electrically connects the selected bus signal line to the IDSEL input 324 of PCI device 326. The address signal carried by that selected bus signal line is thereby uniquely directed to that IDSEL input 324.

The number of bus signal lines dedicated to carrying the binary module identifier determines the maximum number of address signals to choose from, and thus, the maximum number of circuit boards in the module stack 302 to which an address signal on bus signal lines 308, 310, 312, 314 can be uniquely directed. In this case, the two bus signal lines 320, 322, can represent four unique address signals, which are carried by the four bus signal lines 308, 310, 312, 314. Consequently, there can be up to four circuit boards in the module stack 302 that can uniquely direct one of the four address signals to its IDSEL input. In another embodiment using three bus signal lines for the module identifier, each circuit board can select one of eight unique address signals, and thus, there can be up to eight circuit boards in a module stack implementing this feature. In this case of three bus signals lines, there may in fact be more than eight circuit boards in the module stack, but only eight of them can use the module identifier to select a unique address signal.

Also in FIG. 20, top circuit board 328 is shown having an electrical device 330 which also receives bus signal lines 308, 310, 312, 314. Electrical device 330 also receives the electrical signals corresponding to the binary module identifier of top circuit board 328 on bus signal lines 320, 322. Electrical device 330 includes a multiplexer component which selects one of the bus signal lines 308, 310, 312, 314 as indicated by the binary module identifier received on bus signal lines 320, 322, and electrically connects the selected bus signal line to the IDSEL input 332 of PCI device 334. Because the binary module identifier received by top circuit board 328 is different from the binary module identifier received by intermediate circuit board 316, electrical device 330 selects a different bus signal line to connect to the IDSEL input 332 of PCI device 334 than electrical device 318 selects to connect to the IDSEL input 324 of PCI device 326. Thus, a different address signal is directed to IDSEL input 332 than to IDSEL input 324.

Outputting to Dedicated Bus Signal Lines

One particular implementation of a PCI bus requires that PCI devices on the bus direct their interrupt requests to bus signal lines that are dedicated uniquely for that PCI device. The module with a PCI device may not necessarily be preconfigured to connect to any particular dedicated bus signal lines. Again, a module in a module stack can use its module identifier to determine which bus signal lines to direct its interrupt requests to.

Figure 21:
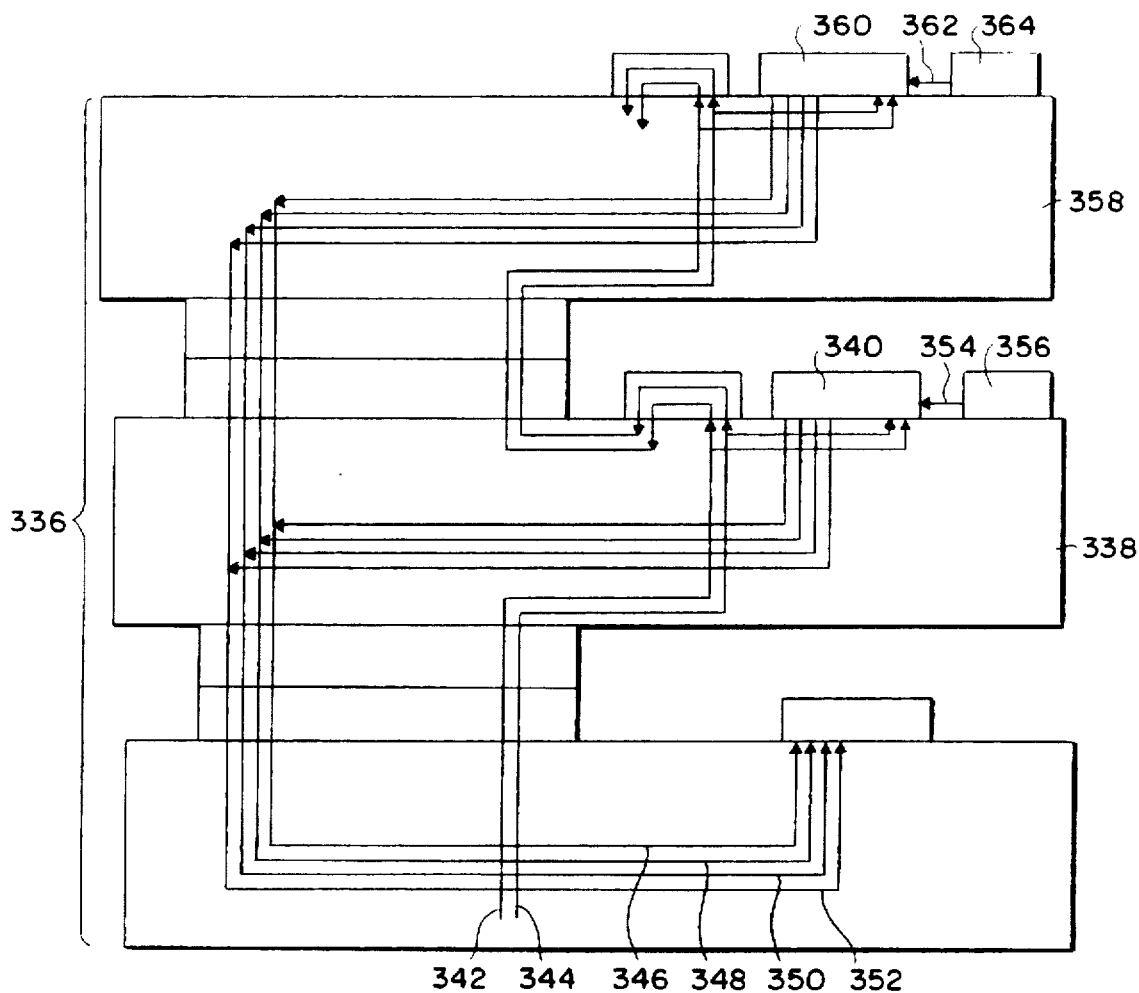
FIG. 21 is a side view of an embodiment of a module stack that implements dedicated output bus signal lines according to the principles of the present invention.

Referring now to FIG. 21, an implementation of a portion of a PCI bus on the module stack 336 is shown using the principles of the present invention so that each circuit board with a PCI device can issue interrupt requests on bus signal lines that are to be used by only that circuit board.

In FIG. 21, intermediate circuit board 338 is shown having an electrical device 340 that receives the electrical signals that correspond to the binary module identifier for intermediate circuit board 338 on bus signal lines 342, 344. Electrical device 340 includes a decoder component which selects one of the bus signal lines 346, 348, 350, 352 as indicated by the binary module identifier received on bus signal lines 342, 344, and electrically connects the selected bus signal line to the INTA output 354 of PCI device 356. The number of bus signal lines corresponding to the binary module identifier determines the number of bus signal lines from which to select an output connection. In this embodiment, the two bus signal lines 342, 344 for carrying the binary module identifier allow for four possible bus signal lines 346, 348, 350, 352, from which one is chosen to be connected to the INTA output 354. Thus, up to four circuit boards in module stack 336 can have their own dedicated bus signal line for INTA interrupt requests. In another embodiment using three bus signal lines for the module identifier, up to eight circuit boards in a module stack can uniquely select a bus signal line to which it can direct an INTA interrupt request. There may in fact be more than eight circuit boards in the module stack, but only eight of them can use the module identifier to select a unique bus signal line that has been dedicated to carry the request.

Also, in FIG. 21, top circuit board 358 is shown having an electrical device 360 that receives the electrical signals corresponding to the binary module identifier for top circuit board 358 on bus signal lines 342, 344. Electrical device 360 includes a decoder component which selects one of the bus signal lines 346, 348, 350, 352 as indicated by the binary module identifier received on bus signal lines 342, 344, and electrically connects the selected bus signal line to the INTA output 362 of PCI device 364. Because the binary module identifier received by top circuit board 358 is different from the binary module identifier received by intermediate circuit board 338 (see Implementation of a Module Identifier), electrical device 360 selects a different bus signal line to connect to the INTA output 362 of PCI device 364 than electrical device 340 selects to connect to the INTA output 354 of PCI device 356.

Figure 22:
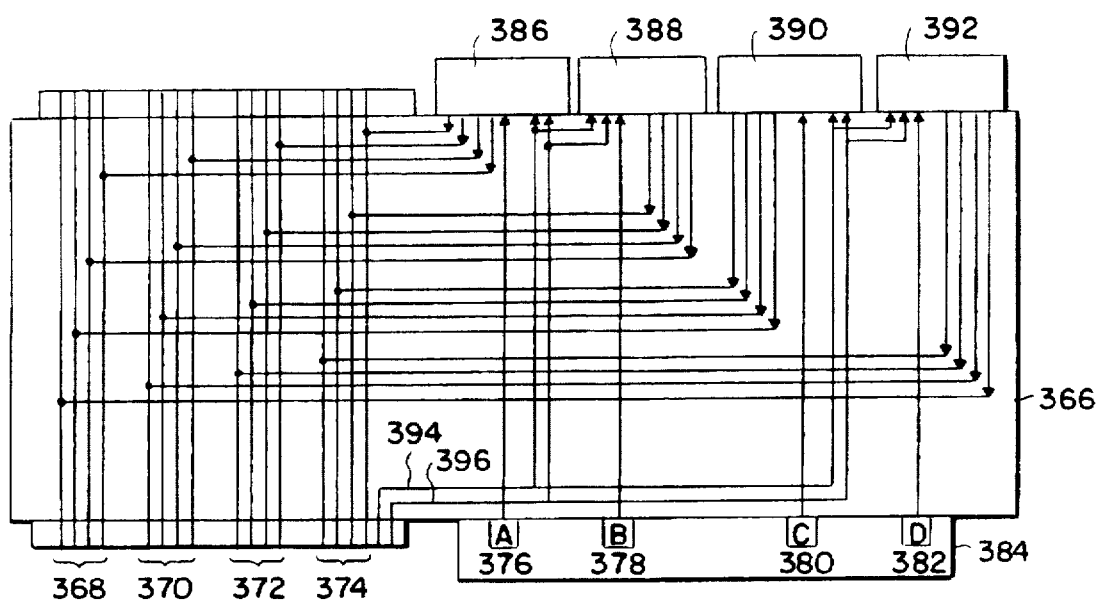
FIG. 22 is a side view of an embodiment of an intermediate circuit board that implements multiple dedicated output bus signal lines according to the principles of the present invention.

Referring now to FIG. 22, an embodiment that accommodates the four interrupt request outputs (INTA, INTB, INTC, and INTD) of a PCI device is shown on intermediate circuit board 366. FIG. 22 shows four sets 368, 370, 372, 374 of four dedicated bus signal lines that are designated to carry interrupt requests from PCI devices on the system bus. Each set 368, 370, 372, 374 dedicates one of its bus signal lines for each interrupt request output INTA 376, INTB 378, INTC 380, and INTD 382 of PCI device 384. Also, each set 368, 370, 372, 374 is designated for use by only one circuit board in a module stack; thus, the number of sets of dedicated bus signal lines that are designated to carry interrupt requests determines the number of circuit boards in a module stack that can use dedicated bus signal lines for that purpose. Increasing the number of such sets to eight and the number of bus signal lines for the module identifier to three allows the module stack to support eight circuit boards.

Also shown in FIG. 22 are four electrical devices 386, 388, 390, 392 on intermediate circuit board 366. Each electrical device 386, 388, 390, 392 is associated with one of the four interrupt request outputs, INTA 376, INTB 378, INTC 380, and INTD 382, respectively, of PCI device 384, and directs that associated interrupt request output to one of the four bus signal lines dedicated to that output. Electrical devices 386, 388, 390, 392 each include a decoder component which selects one of the four bus signal lines dedicated to its associated interrupt request output INTA 376, INTB 378, INTC 380, or INTD 382, respectively, as indicated by the binary module identifier received on bus signal lines 394, 396, and electrically connects the selected bus signal line to that associated interrupt request output. Because each electrical device 386, 388, 390, 392 on intermediate circuit board 366 uses the same binary module identifier to select a bus signal line, all electrical devices 386, 388, 390, 392 will select a bus signal line from the same set of dedicated bus signal lines.

Implementation of PCI Bus Arbitration

Figure 23:
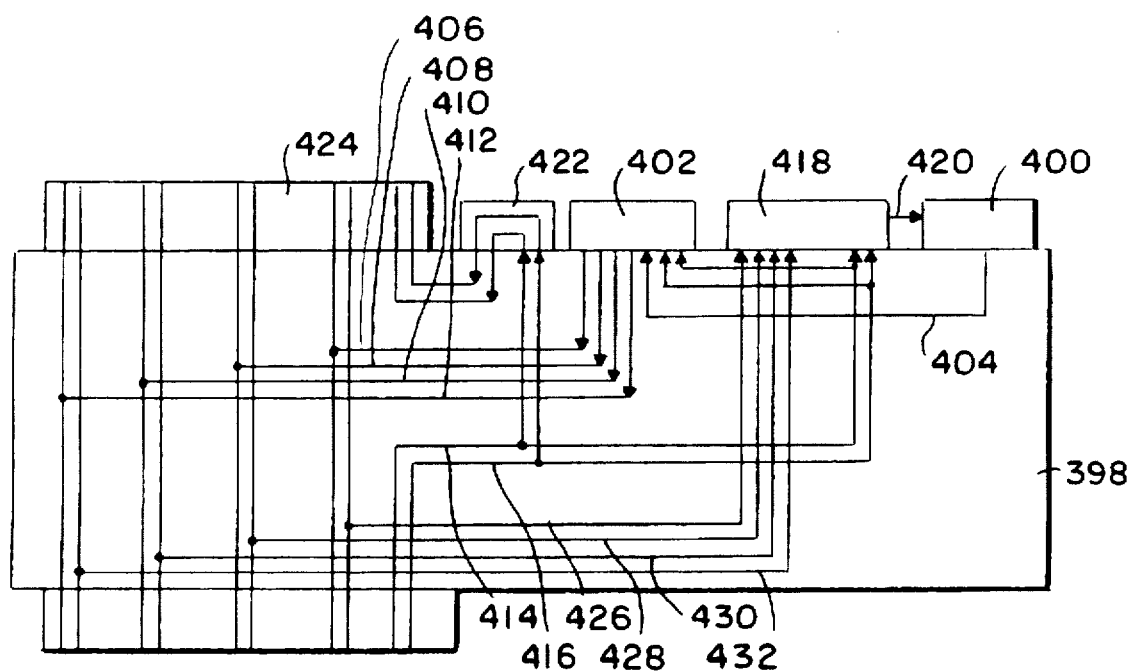
FIG. 23 is a side view of an embodiment of an intermediate circuit board that implements PCI-bus arbitration according to the principles of the present invention.

Referring now to FIG. 23, intermediate circuit board 398 illustrates an embodiment implementing PCI bus arbitration. When PCI device 400 wants to access the system bus it sends bus request signals to electrical device 402 on REQ output 404. Electrical device 402 includes a decoder component which selects one of the bus signal lines 406, 408, 410, 412, as indicated by the binary module identifier received on bus signal lines 414, 416, and directs the bus request signals from the REQ output 404 of PCI device 400 to that selected bus signal line.

To receive permission to access the system bus, electrical device 418, which includes a multiplexer component for selecting one of the bus signal lines 426, 428, 430, 432 as indicated by the binary module identifier received on bus signal lines 414, 416, directs bus grant signals from the selected bus signal line to the GNT input 420 of PCI device 400. As shown, electrical device 422 also receives electrical signals corresponding to a binary module identifier on bus signal lines 414, 416, for modifying the binary module identifier, and supplying the modified binary module identifier to electrical connector 424.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. An apparatus, comprising:
   a first circuit board having surfaces on opposite sides thereof, each of the surfaces having an electrically conductive surface region;
   a first electrical connector on one of the surfaces of the first circuit board, the first electrical connector having an electrically conductive contact disposed on that one of the surfaces adjacent to the electrically conductive surface region, the contact being secured to that electrically conductive surface region without penetrating the first circuit board;
   a second electrical connector on the other surface of the first circuit board, the second electrical connector having an electrically conductive contact disposed on the other surface adjacent to that electrically conductive surface region, the contact being secured to that electrically conductive surface region without penetrating the first circuit board, wherein each of the electrical connectors are for joining to and electrically communicating with an associated electrical connector on another circuit board to conduct electrical signals therebetween;
   an electrically conductive path connecting the two contacts, electrical signals received by one of the contacts of one of the electrical connectors on the first circuit board from a first associated electrical connector when joined thereto being supplied along the electrically conductive path to a second associated electrical connector on yet another circuit board through the other of the contacts of the other of the electrical connectors on the first circuit board when the second associated electrical connector is joined thereto; and
   an electrical device in the electrically conductive path between the two electrical connectors on the first circuit board.

2. The apparatus of claim 1, wherein the electrically conductive path connecting the two contacts extends through the first circuit board.

3. The apparatus of claim 1, wherein the two electrical connectors on the first circuit board are in alignment.

4. The apparatus of claim 1, wherein the two electrical connectors on the first circuit board are female.

5. The apparatus of claim 1, wherein the two electrical connectors on the first circuit board are male.

6. The apparatus of claim 1, wherein the electrical device includes a component that modifies electrical signals supplied to the electrical device.

7. The apparatus of claim 1, wherein the contact of first electrical connector extends substantially orthogonal from the first electrical connector and substantially parallel to that one of the surfaces.

8. The apparatus of claim 1 wherein the contact of the second electrical connector is laterally offset from the contact of the first electrical connector.

9. A computer system, comprising:
   a housing;
   a motherboard secured to the housing, the motherboard having an electrical connector secured on one of the surfaces thereof for transmitting electrical signals therethrough, the electrical signals corresponding to a first module identifier;
   modules including a first module having an electrical connector secured on a surface thereof, the first module being disposed adjacent to the motherboard so that the electrical connector on the first module is joined to and in electrical communication with the electrical connector on the motherboard, the first module for receiving the electrical signals from the motherboard through the joined electrical connectors;

a plurality of electrically conductive paths electrically connecting each of the modules to the motherboard; and an electrical device on the first module coupled to the electrically conductive paths, the electrical device for receiving the electrical signals and, in response to the first module identifier, selecting one of the electrically conductive paths to dedicate that selected path for electrical communication between the motherboard and the first module exclusively for as long as the computer system operates.

10. The computer system of claim 9, further comprising:

a Peripheral Component Interconnect (PCI) device on the first module; and wherein the electrically conductive paths operate as a PCI bus and the electrical device on the first module electrically couples the selected electrically conductive path to a Peripheral Component Interconnect (PCI) device on the first module.

11. The computer system of claim 10, wherein the selected electrically conductive path is coupled to an interrupt output of the PCI device.

12. The computer system of claim 10, wherein the PCI device has an IDSEL input and the selected electrically conductive path is coupled to IDSEL input of the PCI device.

13. The computer system of claim 9, wherein the surface has an electrically conductive surface region, and the electrical connector on the first module has an electrically conductive contact disposed on the surface adjacent to the electrically conductive surface region, the contact being secured to that electrically conductive surface region without penetrating the first module.

14. The computer system of claim 9, wherein the first module includes:

another electrical connector secured on an opposite surface of the first module, the opposite surface having an electrically conductive surface region, the other electrical connector of the first module having an electrically conductive contact disposed on the opposite surface adjacent to that electrically conductive surface region, the contact being secured to that electrically conductive surface region without penetrating the first module; and a second electrical device on the first module for receiving and modifying the first module identifier to produce modified electrical signals corresponding to a second module identifier, and wherein the modules include a second module having an electrical connector secured to a surface thereof, the surface of the second module having an electrically conductive surface region, the electrical connector of the second module having an electrically conductive contact disposed on that surface adjacent to that electrically conductive surface region, the contact being secured to that electrically conductive surface region without penetrating the second module, the second module being disposed adjacent to the first module so that the electrical connector on the second module is joined to and in electrical communication with the other of the two electrical connectors on the first module, the second module for receiving the modified electrical signals corresponding to the second module identifier from the first module through the electrical connector on the second module which is joined to the other of the two electrical connectors on the first module; and an electrical device on the second module coupled to the electrically conductive paths, the electrical device on the second module for receiving the second module identifier and, in response to the second module identifier, selecting another one of the electrically conductive paths to dedicate that selected another one of the electrically conductive paths for electrical communication between the motherboard and the second module exclusively as long as the computer system operates.

15. The computer system of claim 9, wherein the second electrical device on the first module includes a component that increments the first module identifier to produce the second module identifier.

16. The computer system of claim 14, wherein the motherboard is substantially parallel to the first module and the first module is substantially parallel to the second module.

17. The apparatus of claim 16, wherein the motherboard being joined to the first module and the first module being joined to the second module form a vertical stack of modules in the housing.

18. The apparatus of claim 16, wherein the motherboard being joined to the first module and the first module being joined to the second module form a horizontal stack of modules in the housing.

19. The computer system of claim 14, wherein the first module and the second module are memory boards.

20. The computer system of claim 14, wherein the first module is an input/output module and the second module is a video module.

21. The computer system of claim 14, wherein the electrical connector on the second module is a first electrical connector on the second module, and wherein the second module has a second electrical connector secured on an opposing surface of the second module from the first electrical connector on the second module, the opposing surface having an electrically conductive surface region, the second electrical connector of the second module having an electrically conductive contact disposed on the opposing surface adjacent to that electrically conductive surface region, the contact being secured to that electrically conductive surface region without penetrating the second module; and wherein the modules include:

a third module having an electrical connector secured to a surface thereof, the surface of the third module having an electrically conductive surface region, the electrical connector of the third module having an electrically conductive contact disposed on that surface adjacent to that electrically conductive surface region, the contact being secured to that electrically conductive surface region without penetrating the third module the third module being disposed adjacent to the second module so that the electrical connector on the third module is joined to and in electrical communication with the second electrical connector on the second module.

22. A method for interconnecting a plurality of modules in a module stack in a computer system, comprising the steps of:

providing a plurality of electrically conductive paths to each of a plurality of modules arranged in a module stack, the modules including a first module and a second module;

sending electrical signals corresponding to a first module identifier from the first module in the module stack to the second module in the module stack through an electrical connector on the first module that is joined to and in electrical communication with an electrical connector on the second module;

receiving the electrical signals by an electrical device on one of the opposing surfaces of the second module through the joined electrical connectors; and selecting, in response to the first module identifier, one of the electrically conductive paths to dedicate that selected path for electrical communication between the first module and the second module exclusively for as long as the computer system operates.

23. The method of claim 22, wherein the electrically conductive paths operate as a Peripheral Components Interconnect (PCI) bus, and further comprising the step of:

electrically coupling the selected electrically conductive path to a PCI device on the second module.

24. The method of claim 22, further comprising the steps of:

modifying the electrical signals received by the electrical device on the second module to produce modified electrical signals corresponding to a second module identifier; and sending the modified electrical signals corresponding to the second module identifier from the second module to a third module in the module stack through a second electrical connector on the second module that is on the opposing surface of the second module than the other electrical connector on the second module and is joined to and in electrical communication with an electrical connector on the third module; and selecting, in response to the second module identifier, another one of the electrically conductive paths to dedicate that that selected another one of the electrically conductive paths for electrical communication between the first module and the third module exclusively for as long as the computer system operates.

* * * * *